United States Patent
Koya

(10) Patent No.: US 8,938,600 B2
(45) Date of Patent: Jan. 20, 2015

(54) MEMORY SYSTEM, MEMORY CONTROL METHOD, AND RECORDING MEDIUM STORING MEMORY CONTROL PROGRAM

(75) Inventor: Daisuke Koya, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 136 days.

(21) Appl. No.: 13/467,306

(22) Filed: May 9, 2012

(65) Prior Publication Data

US 2012/0311249 A1 Dec. 6, 2012

(30) Foreign Application Priority Data

May 31, 2011 (JP) .................................. 2011-121340

(51) Int. Cl.
*G06F 12/00* (2006.01)
*G06F 13/00* (2006.01)

(52) U.S. Cl.
CPC ............... *G06F 12/00* (2013.01); *G06F 13/00* (2013.01)
USPC .............................. 711/170; 711/104; 714/48

(58) Field of Classification Search
USPC .............................. 711/105, 104, 170; 714/48
See application file for complete search history.

(56) References Cited

U.S. PATENT DOCUMENTS

| 2002/0133684 A1* | 9/2002 | Anderson ..................... 711/200 |
| 2010/0042778 A1* | 2/2010 | Tanguay et al. ............... 711/105 |
| 2012/0060009 A1* | 3/2012 | Marino et al. ................. 711/165 |

FOREIGN PATENT DOCUMENTS

| JP | 2000-187614 | 7/2000 |
| JP | 2001-243114 | 9/2001 |

* cited by examiner

*Primary Examiner* — Kalpit Parikh
(74) *Attorney, Agent, or Firm* — Oblon, Spivak, McClelland, Maier & Neustadt, L.L.P.

(57) ABSTRACT

A memory system includes a dual inline memory module (DIMM) connector to which a DIMM is connected, which is selected from a Joint Electron Device Engineering Council (JEDEC) standard DIMM in compliance with JEDEC standards and a customized DIMM not in compliance with JEDEC standard, and a memory controller to determine whether the DIMM being connected is the JEDEC standard DIMM or the customized DIMM to generate a determination result, and to control access to the DIMM based on the determination result and SPD information obtained from a SPD of the DIMM being connected.

12 Claims, 9 Drawing Sheets

FIG. 6A

| BYTE NUMBER | FUNCTION DESCRIBED | NOTES |
|---|---|---|
| 0 | NUMBER OF SERIAL PD BYTES WRITTEN/SPD DEVICE SIZE/ CRC COVERAGE | 1, 2 |
| 1 | SPD REVISION | |
| 2 | KEY BYTE/DRAM DEVICE TYPE | |
| 3 | KEY BYTE/MODULE TYPE | |
| 4 | SDRAM DENSITY AND BANKS | 3 |
| 5 | SDRAM ADDRESSING | 3 |
| 6 | MODULE NOMINAL VOLTAGE VDD | |
| 7 | MODULE ORGANIZATION | 3 |
| 8 | MODULE MEMORY BUS WIDTH | |
| 9 | FINE TIMEBASE (FTB) DIVIDEND/DIVISOR | |
| 10 | MEDIUM TIMEBASE (MTB) DIVIDEND | |
| 11 | MEDIUM TIMEBASE (MTB) DIVISOR | |
| 12 | SDRAM MINIMUM CYCLE TIME (tCKmin) | 3 |
| 13 | RESERVED | |
| 14 | CAS LATENCIES SUPPORTED, LEAST SIGNIFICANT BYTE | 3 |
| 15 | CAS LATENCIES SUPPORTED, MOST SIGNIFICANT BYTE | 3 |
| 16 | MINIMUM CAS LATENCY TIME (tAAmin) | 3 |

1. NUMBER OF SPD BYTES WRITTEN WILL TYPICALLY BE PROGRAMMED AS 128 OR 176 BYTES.
2. SIZE OF SPD DEVICE WILL TYPICALLY BE PROGRAMMED AS 256 BYTES.
3. FROM DDR3 SDRAM DATASHEET.
4. THESE ARE OPTIONAL, IN ACCORDANCE WITH THE JEDEC SPEC.

FIG. 6B

| BYTE NUMBER | FUNCTION DESCRIBED | NOTES |
|---|---|---|
| 17 | MINIMUM WRITE RECOVERY TIME (tWRmin) | 3 |
| 18 | MINIMUM RAS# TO CAS# DELAY TIME (tRCDmin) | 3 |
| 19 | MINIMUM ROW ACTIVE TO ROW ACTIVE DELAY TIME (tRRDmin) | 3 |
| 20 | MINIMUM ROW PRECHARGE DELAY TIME (tRPmin) | 3 |
| 21 | UPPER NIBBLES FOR tRAS AND tRC | 3 |
| 22 | MINIMUM ACTIVE TO PRECHARGE DELAY TIME (tRASmin), LEAST SIGNIFICANT BYTE | 3 |
| 23 | MINIMUM ACTIVE TO ACTIVE/REFRESH DELAY TIME (tRCmin), LEAST SIGNIFICANT BYTE | 3 |
| 24 | MINIMUM REFRESH RECOVERY DELAY TIME (tRFCmin), LEAST SIGNIFICANT BYTE | 3 |
| 25 | MINIMUM REFRESH RECOVERY DELAY TIME (tRFCmin), MOST SIGNIFICANT BYTE | 3 |
| 26 | MINIMUM INTERNAL WRITE TO READ COMMAND DELAY TIME (tWTRmin) | 3 |
| 27 | MINIMUM INTERNAL READ TO PRECHARGE COMMAND DELAY TIME (tRTPmin) | 3 |
| 28 | UPPER NIBBLE FOR tFAW | 3 |
| 29 | MINIMUM FOUR ACTIVATE WINDOW DELAY TIME (tFAWmin) | 3 |
| 30 | SDRAM OPTIONAL FEATURES | |
| 31 | SDRAM THERMAL AND REFRESH OPTIONS | |
| 32 | MODULE THERMAL SENSOR | |
| 33 | SDRAM DEVICE TYPE | |
| 34 | FINE OFFSET FOR SDRAM MINIMUM CYCLE TIME (tCKmin) | |
| 35 | FINE OFFSET FOR MINIMUM CAS LATENCY TIME (tAAmin) | |
| 36 | FINE OFFSET FOR MINIMUM RAS# TO CAS# DELAY TIME (tRCDmin) | |
| 37 | FINE OFFSET FOR MINIMUM ROW PRECHARGE DELAY TIME (tRPmin) | |
| 38 | FINE OFFSET FOR MINIMUM ACTIVE TO ACTIVE/REFRESH DELAY TIME (tRCmin) | |
| 39-59 | RESERVED, GENERAL SECTION | |
| 60-116 | MODULE TYPE SPECIFIC SECTION, INDEXED BY KEY BYTE 3 | |
| 117-118 | MODULE ID MODULE MANUFACTURER'S JEDEC ID CODE | |
| 119 | MODULE ID MODULE MANUFACTURING LOCATION | |
| 120-121 | MODULE ID MODULE MANUFACTURING DATE | |
| 122-125 | MODULE ID MODULE SERIAL NUMBER | |
| 126-127 | CYCLICAL REDUNDANCY CODE | |
| 128-145 | MODULE PART NUMBER | 4 |
| 146-147 | MODULE REVISION CODE | 4 |
| 148-149 | DRAM MANUFACTURER'S JEDEC ID CODE | 4 |
| 150-175 | MANUFACTURER'S SPECIFIC DATA | 4 |
| 176-255 | OPEN FOR CUSTOMER USE | |

1. NUMBER OF SPD BYTES WRITTEN WILL TYPICALLY BE PROGRAMMED AS 128 OR 176 BYTES.
2. SIZE OF SPD DEVICE WILL TYPICALLY BE PROGRAMMED AS 256 BYTES.
3. FROM DDR3 SDRAM DATASHEET.
4. THESE ARE OPTIONAL IN ACCORDANCE WITH THE JEDEC SPEC.

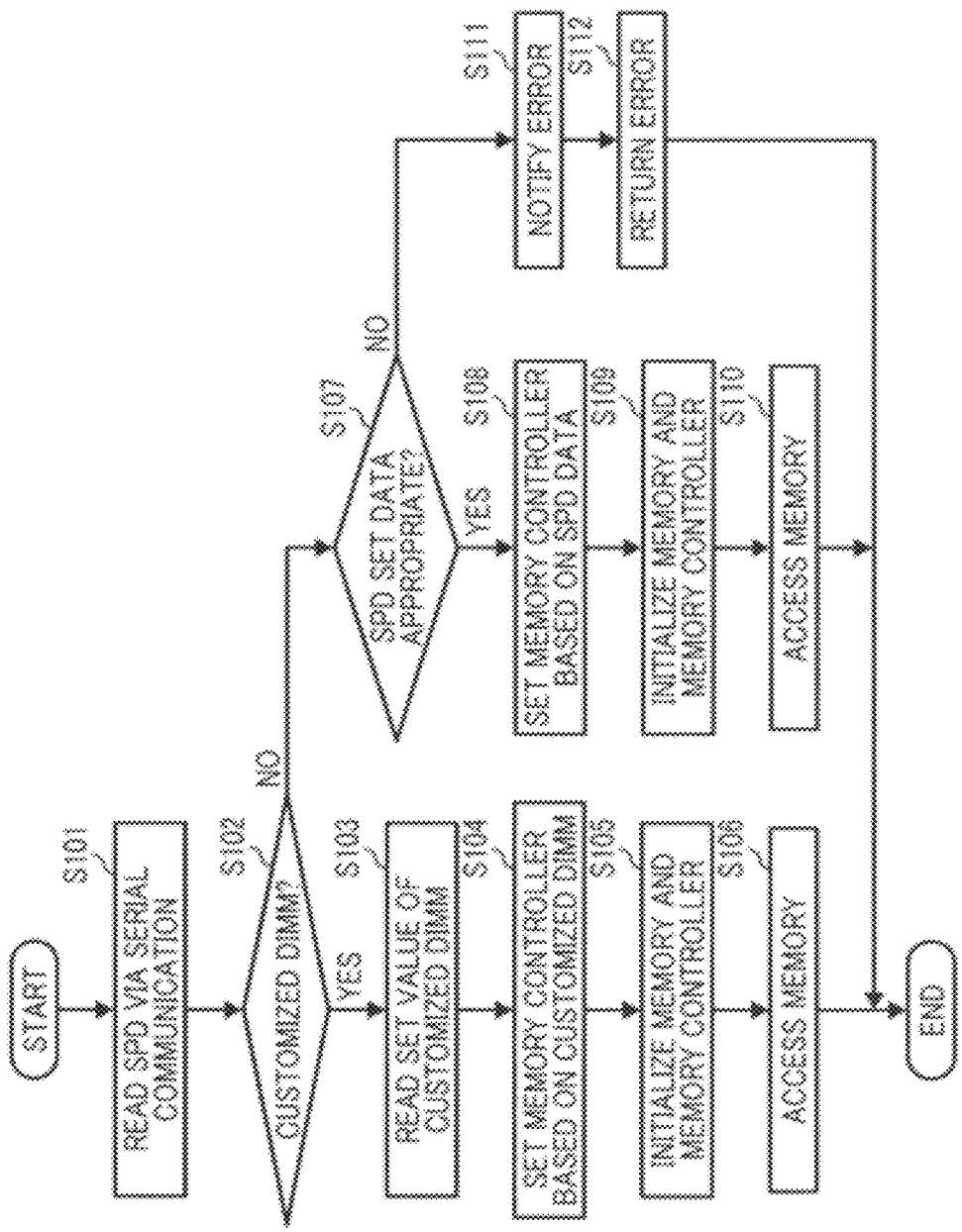

US 8,938,600 B2

MEMORY SYSTEM, MEMORY CONTROL METHOD, AND RECORDING MEDIUM STORING MEMORY CONTROL PROGRAM

CROSS-REFERENCE TO RELATED APPLICATIONS

This patent application is based on and claims priority pursuant to 35 U.S.C. §119 to Japanese Patent Application No. 2011-121340, filed on May 31, 2011, in the Japan Patent Office, the entire disclosure of which is hereby incorporated by reference.

BACKGROUND

1. Field

The present invention generally relates to a memory system, a memory control method, and a recording medium storing a memory control program.

2. Background

The recent image processing apparatuses such as printers, copiers, scanners, and multifunctional peripherals, and information processing apparatuses such as computers are provided with nonvolatile memories having high processing speeds and large capacity sizes such as dynamic random access memories (DRAMs) including, for example, double data rate (DDR)3-SDRAM. SDRAM is integrated as a dual inline memory module (DIMM), which is made in compliance with Joint Electron Device Engineering Council (JEDEC) standards.

For example, the JEDEC committee standardizes a small outline dual in-line memory module (SO-DIMM) used for DDR3 SDRAM in the form of a specification called a Rawcard, which includes: Rawcard-A (2Rank x16 SDRAM), Rawcard-B (1Rank x8 SDRAM), Rawcard-C (1Rank x16 SDRAM), Rawcard-D (2Rank x8 stacked SDRAM), and Rawcard-F (2Rank x8 SDRAM). These Rawcards are all designed for a 64-bit DIMM.

Since the DDR3 SDRAM that is available in the market has a chip capacity of 1 GB (gigabytes) or 2 GB, the capacity sizes of a DIMM are 1 GB or 2 GB for Rawcard-A on which 8 devices are mounted, 512 MB (megabytes) or 1 GB for Rawcard-B on which 8 devices are mounted, 512 MB or 1 GB for Rawcard-C on which 4 devices are mounted, 1 GB or 2 GB for Rawcard-D on which 8 devices are mounted, and 1 GB or 2 GB for Rawcard-F on which 16 devices are mounted, respectively. Accordingly, a DIMM for SO-DIMM has a capacity size of 512 MB, 1 GB, or 2 GB for 8 devices, and 512 MB or 1 GB for 4 devices, as specified by Rawcards. This indicates that, for a system that requires a capacity ranging between 1 GB and 2 GB with a 64-bit bus width, 8 devices are typically used. For a system that only requires a low capacity of 512 MB or less, at least 4 devices are used. Thus, it has been difficult to design a memory system having a low capacity with reduced costs using the DDR3 SDRAMs that are available in the market.

SUMMARY

In view of the above, one aspect of the present invention is to provide a customized DIMM not in compliance with JEDEC standards, which allows a user to design a low capacity memory system with reduced costs.

Another aspect of the present invention is to provide a memory system, a memory control method, and a recording medium storing a memory control program, each of which is capable of controlling the customized DIMM not in compliance with JEDEC standards, in addition to JEDEC standard DIMM.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIGS. 6A and 6B are an illustration of a serial presence detect (SPD) address map for DDR3 SDRAM according to JEDEC standards;

FIG. 7 is a flowchart illustrating operation of controlling a memory such as a DIMM mounted on the memory system, performed by the memory system of FIG. 1, according to an example embodiment of the present invention.

Figure 1:
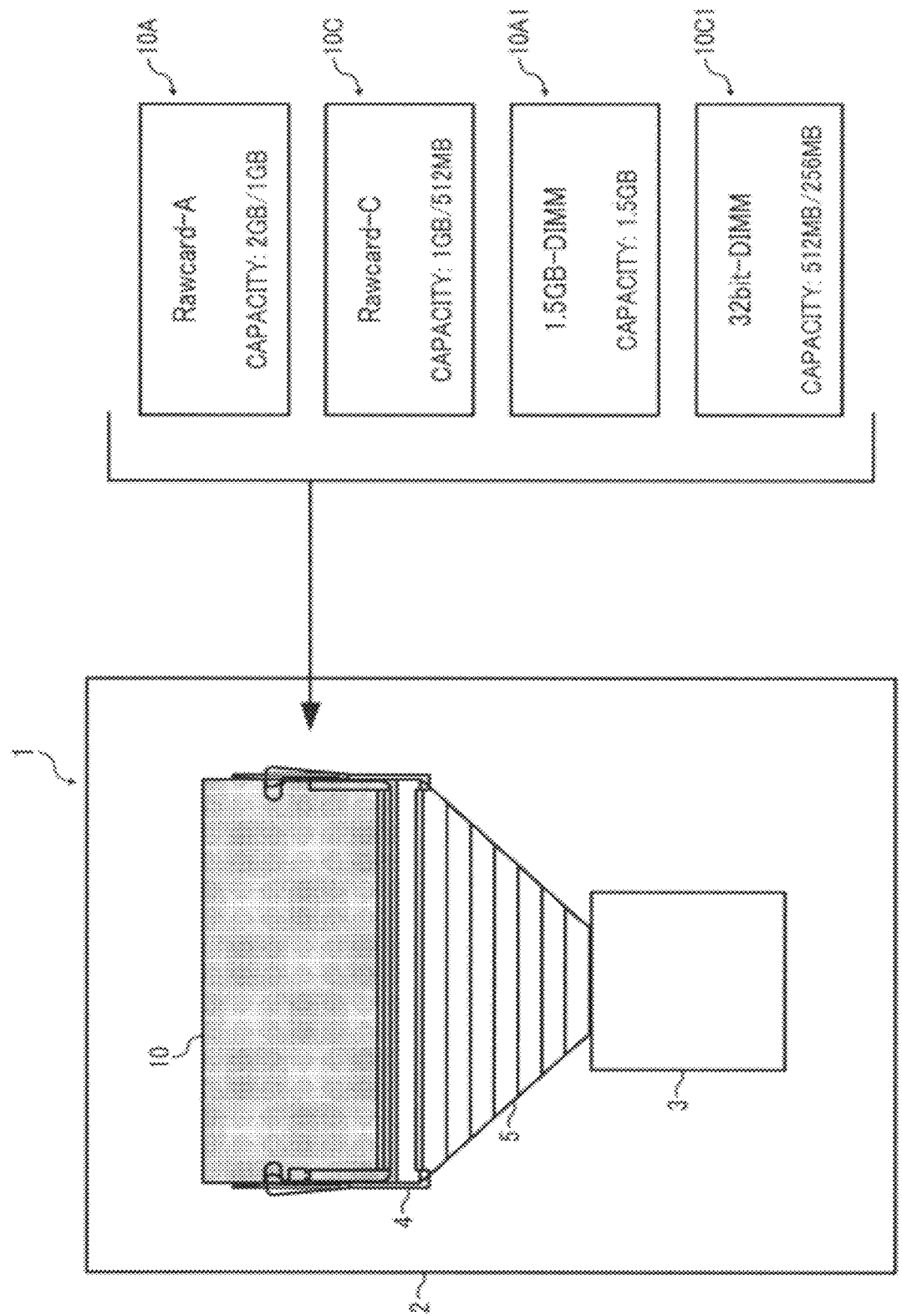
FIG. 1 is a schematic block diagram illustrating a plan view of a memory system, according to an example embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

Referring now to FIGS. 1 to 8, a system and a method of controlling a memory are explained according to an example embodiment of the present invention.

As illustrated in FIG. 1, a memory system 1 includes a memory controller 3 that is mounted on a print wiring board (PWB) 2, a DIMM connector 4, and a memory wiring pattern 5 that connects the DIMM connector 4 and the memory controller 3. The DIMM connector 4 is implemented by a 204 Pin small outline dual in-line memory module interface (SO- DIMM I/F) to which a DIMM 10 is connected or from which the DIMM 10 is removed. For example, the DIMM 10 is selected from a Rawcard-A DIMM 10A in compliance with JEDEC standards, a Rawcard-C DIMM 10C in compliance with JEDEC standards, a customized 1.5 GB DIMM 10A1 not in compliance with JEDEC standards, and a customized 32-bit DIMM 10C1 not in compliance with JEDEC standards. The Rawcard-A DIMM 10A has a capacity size of 2 GB or 1 GB. The Rawcard-C DIMM 10C has a capacity size of 1 GB or 512 MB. The customized 1.5 GB DIMM 10A1 has a capacity size of 1.5 GB. The customized 32-bit DIMM 10C1 has a capacity size of 512 MB or 256 MB.

Since the DIMM connector 4 is made in compliance with JEDEC standards, if the DIMM 10 is selected only from the JEDEC standard DIMM 10A and 10C in compliance with JEDEC standards, the memory system 1 uses such DIMM 10 as a standard memory after checking DIMM 10. As described in the following examples, when the DIMM 10 is selected from the JEDEC standard DIMM 10A and 10C, and customized DIMM 10A1 and 10C1, the memory system 1 firstly determines whether the DIMM 10 being connected is a JEDEC standard memory or a customized memory.

Figure 2:
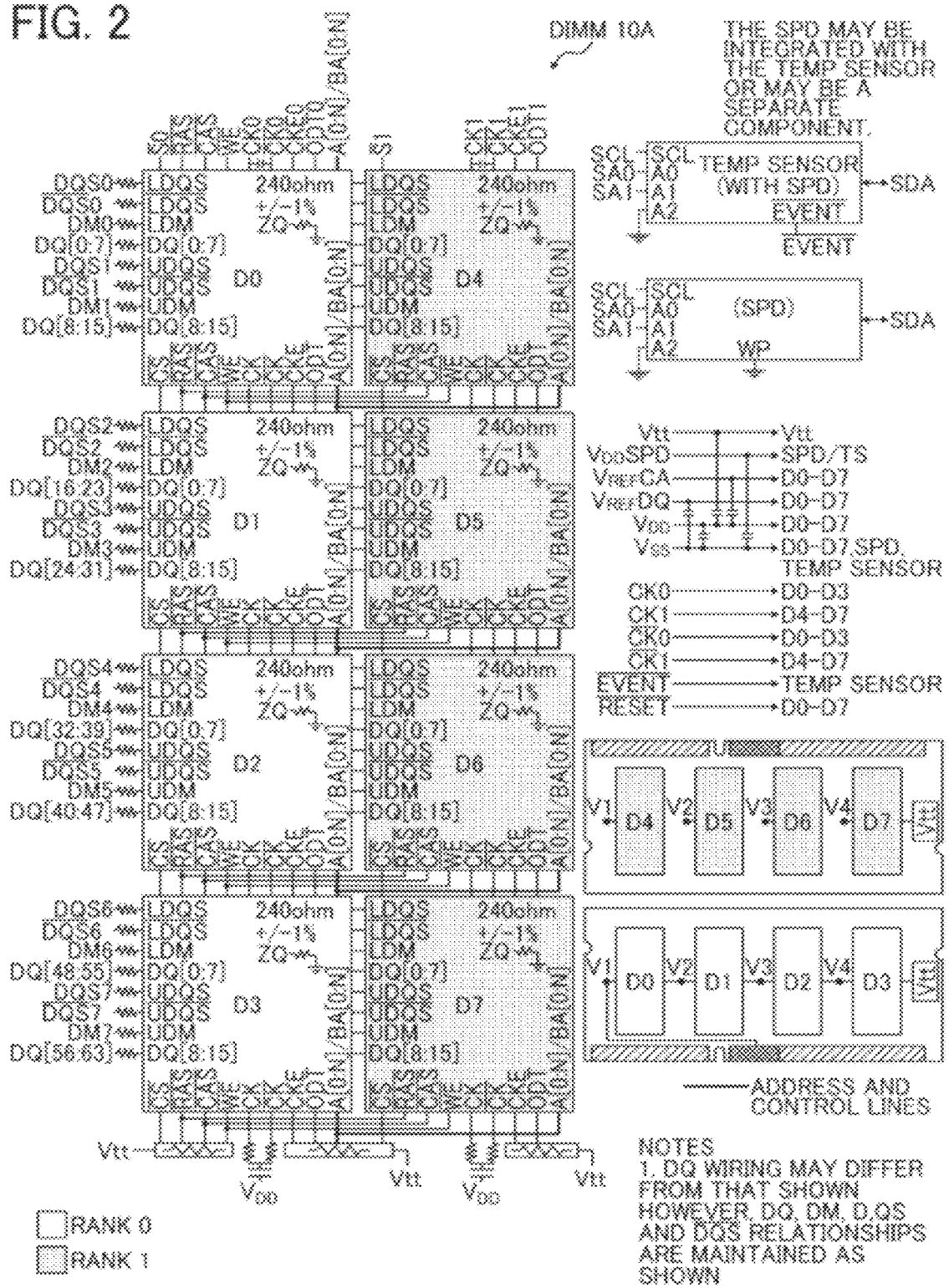
FIG. 2 is a circuit diagram illustrating a Rawcard-A DIMM in compliance with JEDEC standards.

In this example, the Rawcard-A DIMM 10A is a double-data-rate3 (DDR3) SO-DIMM: Rawcard-A in compliance with JEDEC standards. As illustrated in FIG. 2, the Rawcard-A DIMM 10A is a 2Rank DIMM on which eight x16 devices (DRAMs) "D0" to "D7" are mounted. The Rawcard-A DIMM 10A is provided with a serial presence detect (SPD), which is implemented by an electrically erasable programmable read only memory (EEPROM) for storing information regarding characteristics of the DIMM 10A. The SPD defines information regarding a structure of the DIMM 10A such as a chip mounted on the DIMM 10A, which includes information regarding a chip capacity per each rank, for example, as described below referring to FIGS. 6A and 6B. Accordingly, each rank has substantially the same chip capacity such that a device to be mounted has substantially the same capacity size. Assuming that x16 device, i.e., a memory chip, has a capacity size of 1 GB, the DIMM 10A has a capacity size of 1 GB. Assuming that x16 device has a capacity size of 2 GB, the DIMM 10A has a capacity size of 2 GB.

Figure 3:
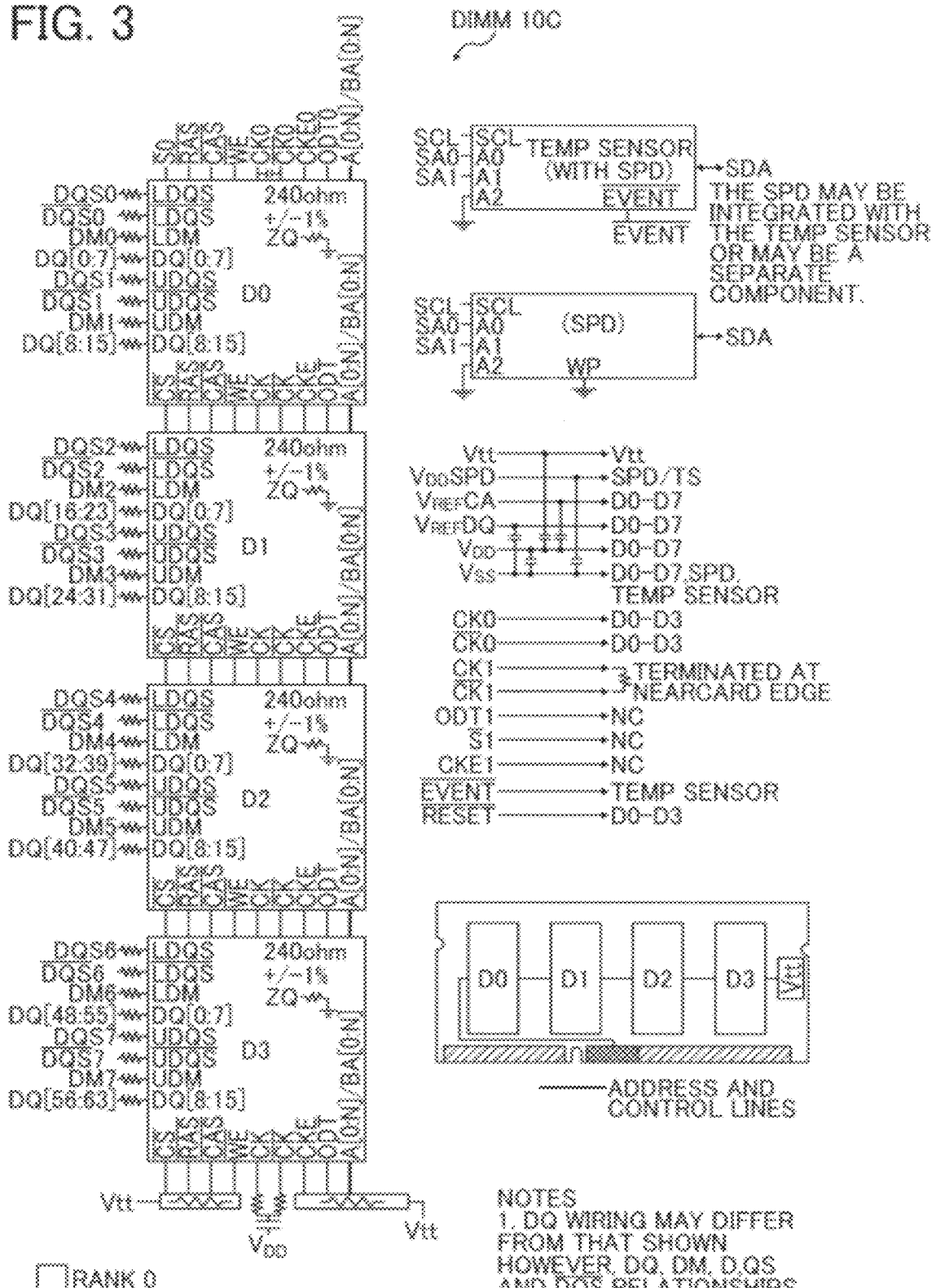
FIG. 3 is a circuit diagram illustrating a Rawcard-C DIMM in compliance with JEDEC standards.

In this example, the Rawcard-C DIMM 10C is a DDR3 SO-DIMM: Rawcard-C in compliance with JEDEC standards. As illustrated in FIG. 3, the Rawcard-C DIMM 10C is a 1Rank DIMM on which four x16 devices (DRAMs) "D0" to "D3" are mounted. The DDR3 SO-DIMM: Rawcard-C has a structure that gives the smallest capacity size among the JEDEC standard DIMMs that can be connected to the DIMM connector 4. The Rawcard-C DIMM 10C has a capacity size of 512 MB when x16 device with 1 GB is mounted, and a capacity size of 1 GB when x16 device with 2 GB is mounted.

Assuming that only JEDEC standard DIMMs 10A and 10C are available, if the memory system 1 requires a capacity size of 2 GB, one 2 GB Rawcard-A DIMM 10A, or two 1 GB Rawcard-C DIMMs 10C, may be used to form a 2 GB memory. If the memory system 1 requires a capacity size of 1.5 GB, one 1 GB Rawcard-A DIMM 10A and one 512 MB Rawcard-C DIMM 10C, or one 1 GB Rawcard-C DIMM 10C and one 512 MB Rawcard-C DIMM 10C, may be combined to form a 1.5 GB memory. This, however, tends to increase the overall manufacturing costs and the circuit size as more than one type of DIMM is used. To save the costs and the circuit size, the memory system 1 is typically mounted with one 2 GB Rawcard-A DIMM 10A, or two 1 GB Rawcard-C DIMMs 10C, to meet the requirements of the memory system 1. This means that, for the memory system that only requires 1.5 GB, 512 MB of memory that is not necessary is additionally provided. In view of this, in this example, the customized 1.5 GB DIMM 10A1 is customarily made based on the DIMM 10A.

Figure 4:
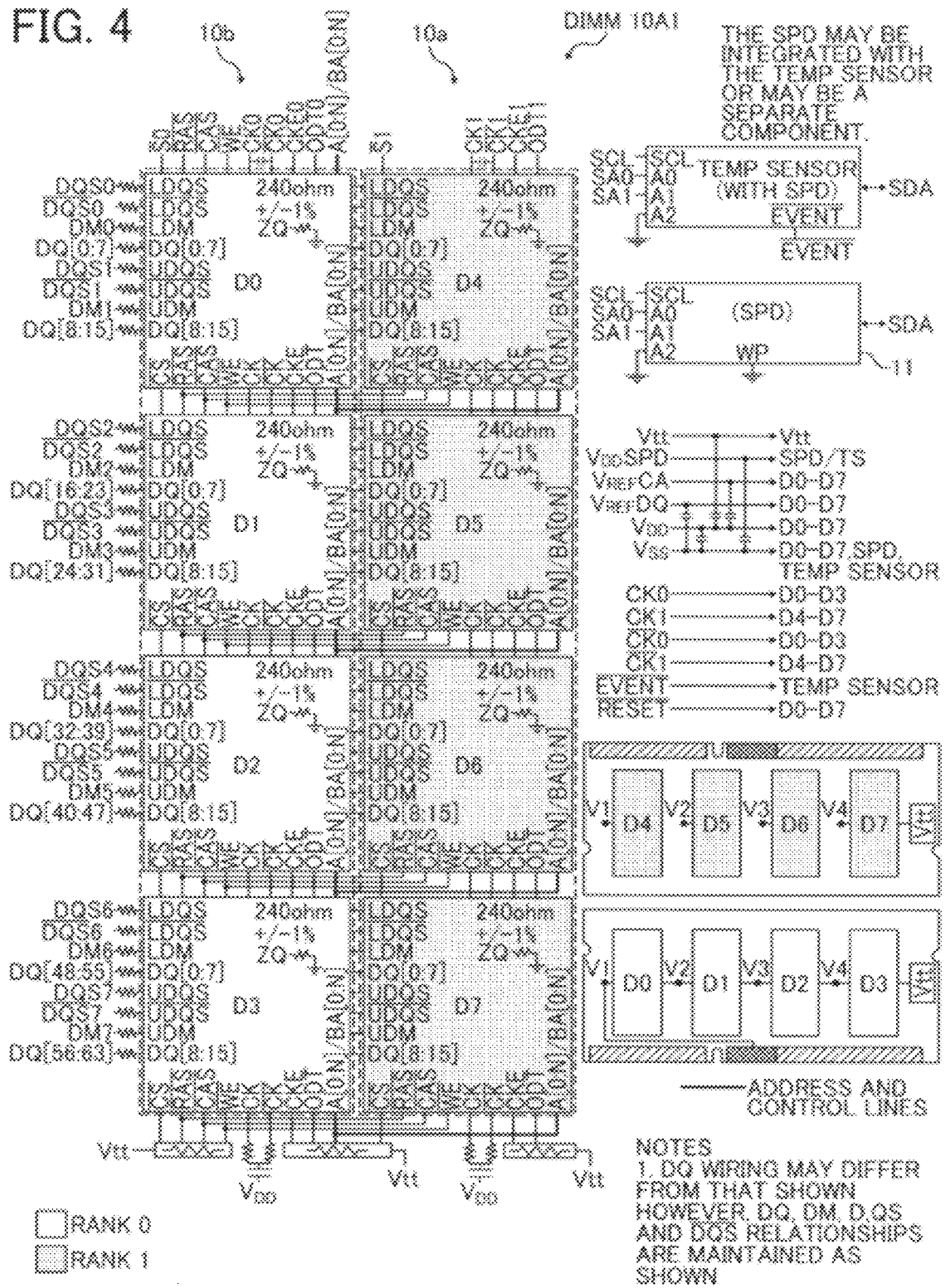
FIG. 4 is a circuit diagram illustrating a customized 1.5 GB DIMM, not in compliance with JEDEC standards.

As illustrated in FIG. 4, the customized 1.5 GB DIMM 10A1 has substantially similar characteristics as that of the Rawcard-A DIMM 10A of FIG. 2, except for some differences including that the DRAMs of the customized 1.5 GB DIMM 10A1 have different capacity size for each rank. More specifically, the customized 1.5 GB DIMM 10A1 includes a DIMM 10a on which four 1 GB DRAMs "D4" to "D7" are mounted for Rank 1, and a DIMM 10b on which four 2 GB DRAMs "D0" to "D3" are mounted for Rank 0. With this structure, the customized 1.5 GB DIMM 10A1 has a capacity size of 1.5 GB. The customized 1.5 GB DIMM 10A1 further includes a SPD 11 storing information regarding characteristics of the customized 1.5 GB DIMM 10A1. For example, as described below referring to FIGS. 6A and 6B, the SPD 11 may store information indicating a chip capacity, which is a capacity per chip, of the DIMM 10A1.

Further, referring back to FIG. 1, assuming that only JEDEC standard DIMMs 10A and 10C are available, if the memory system 1 only requires a capacity size that is less than 512 MB, a 512 MB Rawcard-C DIMM 10C is typically used since the 512 MB Rawcard-C DIMM 10C has the smallest capacity size among JEDEC standard DIMMs. This indicates that, for the memory system that only requires less than 512 MB, an additional memory space is provided even though it is not necessary. In view of this, in this example, the customized 32-bit DIMM 10C1 is customarily made based on the Rawcard-C DIMM 10C.

Figure 5:
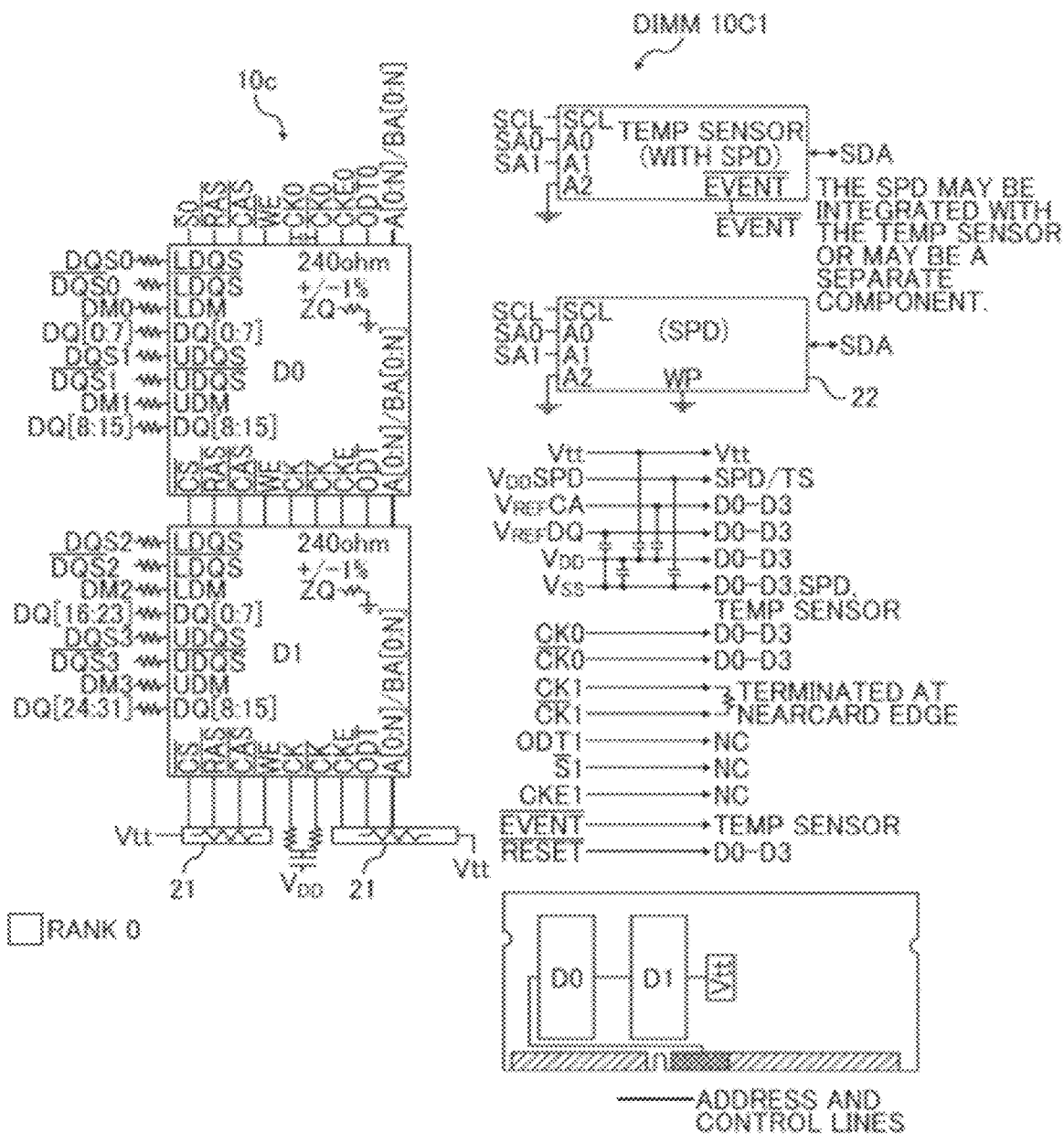
FIG. 5 is a circuit diagram illustrating a customized 32-bit DIMM, not in compliance with JEDEC standards.

As illustrated in FIG. 5, the customized 32-bit DIMM 10C1 is implemented as a 32-bit DIMM, which includes a DIMM 10c on which two x16 devices (DRAMs) "D0" and "D1" and terminating resistors 21 are mounted. Assuming that the 1 GB device is mounted, the customized 32-bit DIMM 10C1 has a capacity size of 256 MB such that a low capacity memory is made available with reduced costs. Further, since the pin assignment of the 204 Pin DIMM connector 4 is the same for 64 bit and 32 bit, the DIMM connector 4 may be commonly used for the customized 32-bit DIMM 10C1. Still referring to FIG. 5, the customized 32-bit DIMM 10C1 further includes a SPD 22 storing information regarding characteristics of the customized 32-bit DIMM 10C1. For example, as described below referring to FIGS. 6A and 6B, the SPD 12 may store information indicating a bus width of the DIMM 10A1.

In operation, assuming that one of the DIMMs 10A, 10C, 10A1, and 10C1 is connected to the DIMM connector 4, as the power of the memory system 1 is turned on, the memory controller 3 refers to the SPD of the DIMM 10 being connected to obtain SPD information regarding characteristics of the DIMM 10. Based on the SPD information, the memory system 1 is able to specify a type of the DIMM 10 on the memory system 1. In such case, when the JEDEC standard DIMM 10, such as the Rawcard-A DIMM 10A or the Rawcard-C DIMM 10C, is connected to the DIMM connector 4, the memory controller 3 checks the SPD to obtain SPD information regarding the JEDEC standard DIMM 10, and causes the memory system 1 including the main controller 3 to be set according to the obtained SPD information. However, when the customized DIMM 10, such as the 1.5 GB DIMM 10A1 or the 32-bit DIMM 10C1, is connected to the DIMM connector 4, the memory controller 3 may return an error as the DIMM 10 is not in compliance with JEDEC standards such that the customized DIMM 10 cannot be accessed. For this reasons, in this example, the memory controller 3 of the memory system 1 is caused to firstly determine a type of the DIMM 10 on the memory system 1 using the SPD information.

More specifically, SPD specified by JEDEC standards is expressed as an address map as illustrated in FIGS. 6A and 6B, which stores information regarding a structure of the DIMM 10 and a memory chip mounted on the DIMM 10 (referred to as "SPD information"). When the power of the memory system 1 is turned on, the memory controller 3 reads out SPD information regarding a memory mounted on the memory system 1 from the SPD on the memory, and sets the memory controller 3 based on the obtained SPD information.

Referring to FIGS. 6A and 6B, entries "Module Type", "SDRAM Density and Banks", "Module Organization", and "Module Memory Bus Width" will be held, respectively, at Byte Numbers 3, 4, 7, and 8.

The "Module Type" entry at Byte Number 3 is stored with information indicating a type of the DIMM 10 such as RDIMM, UDIMM, SO-DIMM, or Micro-DIMM. In this example, information indicating SO-DIMM is stored to indicate that the DIMM 10 is a SO-DIMM.

The "SDRAM Density and Banks" entry at Byte number 4 stores information indicating memory capacity information indicating a memory capacity per chip that is mounted on the DIMM 10. According to the JEDEC standards, the SPD is specified such that a capacity size is the same for all of the DRAMs on the DIMM. Based on the value of the "SDRAM Density and Banks" entry, the chip capacity of the DIMM 10 is determined.

The "Module Organization" entry at Byte number 7 stores information indicating a rank and a bit width of a chip of the DIMM 10. For example, in case of the Rawcard-A DIMM 10A, the "Module Organization" entry stores 2Rank/x16, which indicates that the number of ranks is 2 and a mounted chip has a x16 bit width.

The "Module memory bus width" entry at Byte Number 8 stores information regarding a bus width of the DIMM 10 such as whether 64 bit or 32 bit bus width is used. For the Rawcard-A DIMM 10A, the "Module memory bus width" entry stores information indicating that the bus width is 64 bit.

When the power of the memory system 1 is turned on, the memory system 1 further determines whether the SPD information obtained from the SPD is correctly or appropriately described. When it is determined that the SPD information obtained from the SPD is not correctly or appropriately described, the memory controller 3 returns an error to make a memory unavailable for access.

For example, assuming that the DIMM 10 that is mounted on the memory system 1 is the JEDEC standard Rawcard-A DIMM 10A, the SPD of the Rawcard-A DIMM 10A indicates that the capacity per chip is 1 GB based on the "SDRAM Density and Banks" entry at Byte number 4, and that the number of ranks is 2 and a mounted chip has a x16 bit width based on the "Module Organization" entry at Byte number 7. When the memory controller 3 determines that the SPD information is in compliance with the JEDEC standards, the memory controller 3 is set with this obtained chip capacity information to cause the DIMM 10A to be accessible.

In another example, assuming that the DIMM 10 that is mounted on the memory system 1 is the JEDEC standard Rawcard-C DIMM 10C, the SPD of the Rawcard-C DIMM 10C indicates that the capacity per chip is 1 GB based on the "SDRAM Density and Banks" entry at Byte number 4, and that the number of ranks is 1 and a mounted chip has a x16 bit width based on the "Module Organization" entry at Byte number 7. When the memory controller 3 determines that the SPD information is in compliance with the JEDEC standards, the memory controller 3 is set with the obtained chip capacity information to cause the DIMM 10C to be accessible.

In another example, assuming that the DIMM 10 that is mounted on the memory system 1 is the customized 1.5 GB DIMM 10A1, the SPD 11 of the customized 1.5 GB DIMM 10A1 indicates that the capacity per chip is 1 GB, based on the "SDRAM Density and Banks" entry at Byte number 4, assuming that the SPD 11 is written with chip capacity information for 1 GB DRAM mounted on Rank 1. In such case, the memory controller 3 determines that the capacity of the DIMM 10A1 is 1 GB, which is not accurate, such that the memory system 1 may not be correctly set.

Further, in another example, assuming that the DIMM 10 that is mounted on the memory system 1 is the customized 32-bit DIMM 10C1, the SPD 12 of the customized 32-bit DIMM 10C1 indicates that the DIMM 10C1 is not in compliance with the JEDEC standards, for example, based on the "Module type" entry at Byte Number 3 indicating the SO-DIMM and the "Module memory bus width" entry at Byte Number 8 indicating that the bus width is 32 bit. Since there is no SO-DIMM having a 32-bit bus width according to the JEDEC standards, the memory controller 3 determines that the DIMM 10C1 is not supported, and returns an error.

In order to allow the memory system 1 to be correctly set at the time of execution even when the customized DIMM 10 is connected, the memory controller 3 determines whether the DIMM 10 mounted on the memory system 1 is the JEDEC standard DIMM 10, or the customized DIMM 10 not in compliance with JEDEC standards, using the SPD information obtained from the DIMM 10 to generate a determination result. Based on this determination result and the SPD information, the memory controller 3 determines operation to be performed next to make the memory accessible or not accessible.

For example, when the memory controller 3 determines that the customized 1.5 GB DIMM 10A1 is connected to the DIMM connector 4, the memory controller 3 performs operation according to the SPD information obtained from the DIMM 10A1 to make the customized 1.5 GB DIMM 10A1 to be accessible. In another example, when the memory controller 3 determines that the customized 32-bit DIMM 10C1 is connected to the DIMM connector 4, the memory controller 3 performs operation according to the SPD information obtained from the DIMM 10C1, which includes operation of switching the bus width from 64 bit to 32 bit to make the customized 32-bit DIMM 10C1 to be accessible.

More specifically, the memory controller 3 performs operation of determining a type of the DIMM 10 according to a memory control program. The memory controller 3 includes a central processing unit (CPU), a read only memory (ROM), and a random access memory (RAM) functioning as a work memory of the CPU. The ROM stores various programs therein for execution by the CPU, for example, the memory control program. The CPU loads the memory control program read out from the ROM onto the RAM to cause the memory system 1 to perform operation of controlling memory access according to the memory control program. The memory control operation includes determining a type of the DIMM 10 mounted on the memory system 1, and controlling memory access according to the determined DIMM type. More specifically, the memory controller 3 determines whether the DIMM 10 connected to the DIMM connector 4 is the JEDEC standard DIMM 10, or the customized DIMM 10 such as the customized 1.5 GB DIMM 10A1 or the customized 32-bit DIMM 10C1. The memory controller 3 causes the memory system 1 to be set based on the determined type of the DIMM 10.

Referring to FIG. 7, operation of determining whether the DIMM 10 is the JEDEC standard DIMM or the customized DIMM, performed by the memory controller 3, is explained according to an example embodiment of the present invention. Operation of FIG. 8 may be performed when the power of the memory system 1 is turned on, after the DIMM 10 is connected to the DIMM connector 4.

At S101, the memory controller 3 reads out the SPD information from the SPD of the DIMM 10 that is mounted on the memory system 1 via a serial communication line.

At S102, the memory controller 3 determines whether the DIMM 10 that is mounted is a customized DIMM 10.

In one example, each one of the SPD 11 of the customized 1.5 GB DIMM 10A1 and the SPD 22 of the customized 32-bit DIMM 10C1 is provided with a "Reserved" bit at the "Module Type" entry at Byte Number 3. This "Reserved" bit may be assigned to customized DIMM data, which indicates that the DIMM 10 is a customized DIMM. At S102, the memory controller 3 may read out the "Reserved" bit of the "Module Type" entry from the SPD to determine whether the DIMM 10 is the JEDEC standard or customized.

In another example, each one of the SPD 11 of the customized 1.5 GB DIMM 10A1 and the SPD 22 of the customized 32-bit DIMM 10C1 is provided with one or more "Reserved" Byte Numbers such as the Byte Number 13, as illustrated in FIG. 6A. This "Reserved" Byte Number 13 may be registered with a specific value indicating that the DIMM 10 is a customized DIMM. At S102, the memory controller 3 may read out the "Reserved" Byte Number 13 to determine whether the DIMM 10 is the JEDEC standard or customized.

Alternatively, the memory controller 3 may read out both of the "Reserved" bit of the "Module Type" entry at Byte Number 3 and the "Reserved" Byte Number 13 to determine whether the DIMM 10 is the JEDEC standard or customized. Alternately, the memory controller 3 may use any one of data read out from "Reserved" bit of the "Module Type" entry at Byte Number 3 or the "Reserved" Byte Number 13, in combination with any other SPD information such as the Byte Numbers 117 to 119 storing information regarding a manufacturer, to determine whether the DIMM 10 is the JEDEC standard or customized. By using more than one data type, whether the DIMM 10 is the JEDEC standard or customized may be determined with improved accuracy.

In any one of the above-described cases, the memory controller 3 compares a specific set value of the SPD information, which is assigned to indicate whether the DIMM 10 is the customized DIMM, with a previously set value that is previously stored in the ROM of the memory controller 3. When the specific set value and the previously set value match, the memory controller 3 determines that the DIMM 10 being connected is the customized DIMM.

When it is determined that the DIMM 10 that is mounted is the customized DIMM 10 ("YES" at S102), the operation proceeds to S103 to read out the SPD set values of the customized DIMM 10. At S104, the memory controller 3 is set based on the SPD set values obtained at S103. At S105, the DIMM 10 and the memory controller 3 are initialized. When they are initialized, the operation proceeds to S106 to change a status of the DIMM 10 such that it can be freely accessed, and the operation ends.

As described above, when the DIMM 10 is determined to be the customized DIMM, the memory controller 3 is set with the obtained SPD information, without checking whether the set values of the SPD is in compliance with the JEDEC standards or even when the set values of the SPD is not in compliance with the JEDEC standards. This makes the customized DIMM to be accessible, as long as the DIMM 10 is determined to be the customized DIMM that is previously defined.

When it is determined that the DIMM 10 that is mounted is not the customized DIMM 10 ("NO at S102), the operation proceeds to S107 to further determine whether the SPD set values of the standard DIMM 10 are correctly set. More specifically, the memory controller 3 determines whether the SPD is stored with any values that are not in compliance with JEDEC standards. For example, according to the JEDEC standards, the "Bit3-5" and "Bit 2-0" for the Byte Number 7 are each supposed to not to have the value "111" (Reserved). For this reasons, when the memory controller 3 reads out the "111" value from the Bit 3-5 or Bit 2-0 of Byte Number 7 from the SPD, the memory controller 3 determines that the set values of the SPD are not correctly set.

When it is determined that the SPD set values are correctly set ("YES" at S107), the operation proceeds to S108 to cause the memory controller 3 to be set with the SPD set values of the SPD that is obtained at S107. At S109, the DIMM 10 and the memory controller 3 are initialized. When initialization is completed, the operation proceeds to S110 to change a status of the DIMM 10 such that it can be freely accessed, and the operation ends.

When it is determined that the SPD set values are not correctly set ("NO" at S107), the operation proceeds to S111 to cause the memory controller 3 to notify an error. For example, assuming that the memory system 1 is installed onto an image processing apparatus such as a MFP, the memory controller 3 causes an operation panel of the MFP to display an error message. In another example, the memory controller 3 debugs the SPD information to fix the error, which is detected in the SPD information.

At S112, the memory controller 3 prohibits the DIMM 10 from being accessed, and the operation ends.

Figure 8:
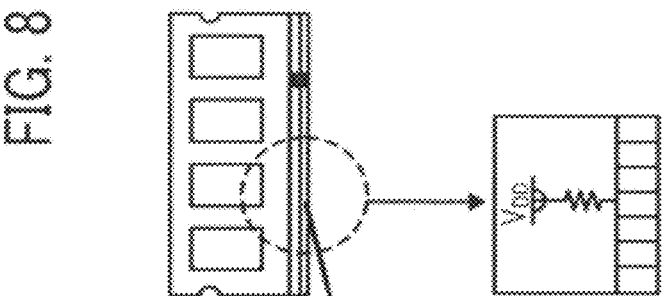
FIG. 8 is an illustration for explaining operation of determining whether a DIMM mounted on the memory system is in compliance with JEDEC standards.

Operation of FIG. 8 may be performed in various other ways. For example, when the memory controller 3 debugs the SPD information at S111, the operation may return to S107.

In another example, at S102, the memory controller 3 determines whether the DIMM 10 that is mounted on the memory system 1 is the standard DIMM or the customized DIMM, based on comparison between the SPD information that is read out from the DIMM 10 and data stored in the ROM of the memory controller 3. Since the SPD of the DIMM 10 can be rewritten, the memory controller 3 may determine that the DIMM 10 is the customized DIMM 10A1 or 10C1 based on a specific entry or a Byte Number of the SPD, even when the other customized DIMM, which is different from the customized DIMM 10A1 or 10C1, is mounted.

In alternative to determining based on the SPD set values, the memory controller 3 may determine whether the DIMM 10 is the customized DIMM 10A1 or 10C1 based on a hardware structure of the DIMM 10 as described below referring to FIG. 8.

Referring to FIG. 8, a non-connected terminal of a pin with the number 122, which is specified by the JEDEC standards, is assigned as a pin used for determining whether the DIMM 10 is the standard DIMM or the customized DIMM. The pin 122 is made to a pulled-up state within the circuit of the DIMM 10. The memory controller 3 detects whether the terminal of the pin 122 is high or low to determine whether the DIMM 10 is the standard DIMM or the customized DIMM.

Alternatively, the DIMM 10 may be provided with a switch, which is remotely controlled by a user to indicate whether the DIMM 10 is the standard DIMM or the customized DIMM. This, however, increases the workload for the user, and if the user accidentally forgets to change the value of switch, the memory controller 3 may not be able to correctly determine a type of the DIMM 10.

As described above, the memory controller 3 determines whether the DIMM 10 being connected to the DIMM connector 4 is the JEDEC standard DIMM or the customized DIMM. The memory controller 3 controls access to the DIMM 10 using SPD information obtained from the DIMM 10, based on the determination on the DIMM type.

Accordingly, even when the customized DIMM 10 not in compliance with the JEDEC standards is mounted on the memory system 1, the memory controller 3 is able to execute the memory system 1.

For example, the DIMM is implemented as a SO-DIMM, and the DIMM connector 4 is implemented as a connector for SO-DIMM such as a SO-DIMM interface. This allows the memory system 1 to be compact in size.

Further, the customized DIMM 10 allows a user to design the memory system 1 that satisfies the capacity requirements with reduced costs, even when the memory system 1 only requires a low capacity.

In one example, the customized DIMM 10 is a DIMM having at least two ranks each having a chip capacity different from each other, such as the 1.5 GB DIMM 10A1. With this customized DIMM 10, the memory system 1 of 1.5 GB is implemented with reduced costs without wasting a memory.

In one example, the customized DIMM 10 is a 32-bit DIMM on which two memory chips and terminating resistors are mounted on one rank, such as the 32-bit DIMM 10C1. With this customized DIMM 10, the memory system 1 that only requires less than 512 MB is implemented with reduced costs without wasting a memory.

The memory controller 3 of the memory system 1 determines a type of the DIMM 10 based on SPD information obtained from the DIMM 10. Since the SPD information can be used, no additional hardware structure is required.

Alternatively, the memory controller 3 may determine a type of the DIMM 10 based on a state of a specific pin of the DIMM 10, such as a pull-up state of a pin 122. Since the pin can be used, no additional hardware structure is required.

Further, the memory system 1 of FIG. 1 may be incorporated in any desired apparatus such as an image processing apparatus or an information processing apparatus. For example, the memory system 1 may be provided on a facsimile board, which is incorporated in an image processing apparatus provided with a facsimile function.

Numerous additional modifications and variations are possible in light of the above teachings. It is therefore to be understood that within the scope of the appended claims, the disclosure of the present invention may be practiced otherwise than as specifically described herein.

With some embodiments of the present invention having thus been described, it will be obvious that the same may be varied in many ways. Such variations are not to be regarded as a departure from the spirit and scope of the present invention, and all such modifications are intended to be included within the scope of the present invention.

For example, elements and/or features of different illustrative embodiments may be combined with each other and/or substituted for each other within the scope of this disclosure and appended claims.

Further, any of the above-described devices or units can be implemented as a hardware apparatus, such as a special-purpose circuit or device, or as a hardware/software combination, such as a processor executing a software program.

Further, as described above, any one of the above-described and other methods of the present invention, such as the memory control program or method, may be embodied in the form of a computer program stored in any kind of storage medium. Examples of storage mediums include, but are not limited to, flexible disk, hard disk, optical discs such as CD-ROM, CD-RW, DVD, magneto-optical discs, magnetic tapes, nonvolatile memory cards such as SD cards, ROM (read-only-memory), EEPROM (electrically erasable and programmable read only memory), EPROM, flash memory, etc. Further, any one of the above-described and other methods of the present invention, such as the memory control program or method, may be written in any desired computer readable language including, for example, legacy programming language such as assembler, C, C++, C#, and Java, and an object-oriented programming language.

Alternatively, any one of the above-described and other methods of the present invention may be implemented by ASIC, prepared by interconnecting an appropriate network of conventional component circuits or by a combination thereof with one or more conventional general purpose microprocessors and/or signal processors programmed accordingly.

The invention claimed is:

1. A memory system, comprising:
a dual inline memory module (DIMM) connector to which a DIMM is connected, the DIMM being selected from a Joint Electron Device Engineering Council (JEDEC) standard DIMM in compliance with JEDEC standards and a customized DIMM not in compliance with JEDEC standards; and
a memory controller to determine whether the DIMM being connected is the JEDEC standard DIMM or the customized DIMM to generate a determination result, and to control access to the DIMM based on the determination result and serial presence detect (SPD) information obtained from an SPD of the DIMM being connected, wherein
when the determination result indicates that the DIMM being connected is the JEDEC standard DIMM, the memory controller determines whether a setting value of the SPD information is correctly set according to the JEDEC standard, and when the setting value of the SPD information is not correctly set according to the JEDEC standard, the memory controller does not enable the access to the DIMM, and
when the determination result indicates that the DIMM being connected is the customized DIMM, even if the setting value of the SPD information is not correctly set according to the JEDEC standard, the memory controller enables the access to the DIMM.

2. The memory system of claim 1, wherein the DIMM includes a small outline (SO)-DIMM, and the DIMM connector includes a connector that is in compliance with the SO-DIMM.

3. The memory system of claim 1, wherein the customized DIMM includes:
a DIMM having a plurality of ranks including a first rank and a second rank each of which is provided with a memory chip, wherein the memory chip of the first rank has a capacity different from a capacity of the memory chip of the second rank.

4. The memory system of claim 1, wherein the customized DIMM includes:
a 32-bit DIMM having one rank on which two memory chips and terminating resistors are mounted.

5. The memory system of claim 1, wherein the memory controller determines whether the DIMM being connected is the customized DIMM, based on the SPD information obtained from the SPD of the DIMM being connected.

6. The memory system of claim 5, wherein the memory controller determines that the DIMM being connected is the customized DIMM, when the SPD information obtained from the SPD includes a reserved bit or a reserved byte that is specially assigned to indicate whether the DIMM being connected is the customized DIMM.

7. The memory system of claim 1, wherein the memory controller determines whether the DIMM being connected is the customized DIMM, based on a state of a specific pin of the DIMM being connected.

8. The memory system of claim 7, wherein the specific pin of the DIMM being connected is a pin with a number 122 as specified by the JEDEC standards.

9. An image processing apparatus, comprising:
the memory system of claim 1.

10. The memory system of claim 1, wherein the memory controller causes an operation panel to display an error message, when the determination result indicates that the DIMM being connected is the JEDEC standard DIMM and when the setting value of the SPD information is not correctly set according to the JEDEC standard.

11. A method of controlling a memory system including a dual inline memory module (DIMM) connector connectable to a DIMM, the DIMM being selected from a Joint Electron Device Engineering Council (JEDEC) standard DIMM in compliance with JEDEC standards and a customized DIMM not in compliance with JEDEC standards, the method comprising:
determining, when the DIMM is being connected to the DIMM connector, whether the DIMM being connected is the JEDEC standard DIMM or the customized DIMM to generate a determination result;
controlling, by a memory controller, access to the DIMM based on the determination result and serial presence detect (SPD) information obtained from an SPD of the DIMM being connected, wherein
when the determination result indicates that the DIMM being connected is the JEDEC standard DIMM, determining whether a setting value of the SPD information is correctly set according to the JEDEC standard, and when the setting value of the SPD information is not correctly set according to the JEDEC standard, the controlling does not enable the access to the DIMM, and
when the determination result indicates that the DIMM being connected is the customized DIMM, even if the setting value of the SPD information is not correctly set according to the JEDEC standard, the controlling enables the access to the DIMM.

12. A non-transitory recording medium storing a plurality of instructions which, when executed, cause a processor to perform a method of controlling a memory system including a dual inline memory module (DIMM) connector connectable to a DIMM, the DIMM being selected from a Joint Electron Device Engineering Council (JEDEC) standard DIMM in compliance with JEDEC standards and a customized DIMM not in compliance with JEDEC standard, the method comprising:
determining, when the DIMM is being connected to the DIMM connector, whether the DIMM being connected is the JEDEC standard DIMM or the customized DIMM to generate a determination result;
controlling access to the DIMM based on the determination result and serial presence detect (SPD) information obtained from an SPD of the DIMM being connected, wherein
when the determination result indicates that the DIMM being connected is the JEDEC standard DIMM, determining whether a setting value of the SPD information is correctly set according to the JEDEC standard, and when the setting value of the SPD information is not correctly set according to the JEDEC standard, the controlling does not enable the access to the DIMM, and
when the determination result indicates that the DIMM being connected is the customized DIMM, even if the setting value of the SPD information is not correctly set according to the JEDEC standard, the controlling enables the access to the DIMM.

* * * * *